US006836871B2

(12) United States Patent
Lachman et al.

(10) Patent No.: US 6,836,871 B2
(45) Date of Patent: Dec. 28, 2004

(54) PROCESS AND SYSTEM FOR DEVELOPING DYNAMIC CIRCUIT GUIDELINES

(75) Inventors: Jonathan E. Lachman, Fort Collins, CO (US); Jason R. Gunderson, Fort Collins, CO (US); Robert McFarland, Murphy, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 87 days.

(21) Appl. No.: 10/282,478

(22) Filed: Oct. 29, 2002

(65) Prior Publication Data

US 2004/0083436 A1 Apr. 29, 2004

(51) Int. Cl.[7] .............................................. G06F 17/50
(52) U.S. Cl. .................................. 716/1; 716/2; 716/5
(58) Field of Search ................................. 716/1–6, 18

(56) References Cited

U.S. PATENT DOCUMENTS

| | | | |
|---|---|---|---|
| 5,452,225 | A | 9/1995 | Hammer |
| 5,535,370 | A | 7/1996 | Raman et al. |
| 5,768,160 | A | 6/1998 | Kakegawa |
| 5,995,425 | A | 11/1999 | Henkels et al. |
| 6,009,256 | A | 12/1999 | Tseng et al. |
| 6,028,983 | A | 2/2000 | Jaber |
| 6,072,947 | A | 6/2000 | Roychowdhury et al. |
| 6,111,422 | A | 8/2000 | Storino et al. |
| 6,163,173 | A | 12/2000 | Storino et al. |
| 6,182,258 | B1 | 1/2001 | Hollander |
| 6,189,133 | B1 | 2/2001 | Durham et al. |
| 6,288,572 | B1 | 9/2001 | Nowka |
| 6,300,819 | B1 | 10/2001 | De et al. |
| 6,326,814 | B1 | 12/2001 | Stasiak et al. |
| 6,378,112 | B1 | 4/2002 | Martin et al. |
| 6,396,305 | B1 | 5/2002 | Carlson |
| 6,567,773 | B1 * | 5/2003 | Rahmat et al. ................ 703/14 |
| 6,668,358 | B2 * | 12/2003 | Friend et al. .................. 716/2 |
| 2003/0192014 | A1 * | 10/2003 | Chng ............................. 716/4 |
| 2004/0002846 | A1 * | 1/2004 | Lutz et al. ..................... 703/19 |

FOREIGN PATENT DOCUMENTS

EP 0529800 A3 3/1993

OTHER PUBLICATIONS

Assaderaghi et al., "Partially Depleted Silicon–on–Insulator (SOI): a Device Design/Modeling and Circuit Perspective," IEEE, Nov. 2, 2000, pp. 201–204.*
Irwin et al., "Dynamic Circuit Synthesis Using the Owens Tool Set," IEEE, Sep. 1998, pp. 205–210.*
Su et al., "Measurement and Modeling of Self–Heating in SOI NMOSFET's," IEEE, Jan. 1994, pp. 69–75.*
Fayed et al., "Noise–Tolerant Design and Analysis for a Low–Voltage Dynamic Full Adder Cell," IEEE, 2002, pp. 579–582.*
MacDonald et a., "Testing Dominno Circuits in SOI Technology," IEEE, Dec. 2000, pp. 441–446.*
Foreign Search Report, Application No. GB 0325030.5, Examiner P. Marshall, date of search Feb. 9, 2004, pp. 1.
U.S patent application Ser. No. 10/282,342, Gunderson et al., filed Oct. 29, 2002.

* cited by examiner

Primary Examiner—Vuthe Siek

(57) ABSTRACT

A system and method for generating dynamic circuit design guidelines is disclosed comprising modeling a dynamic circuit using one of a plurality of modeling circuit types, simulating the modeled dynamic circuit, extracting selected information from raw data measured during the simulating step, and analyzing the selected information to create the dynamic circuit design guidelines.

30 Claims, 2 Drawing Sheets

FIG. 5A

| PHLD RATIO | 75mV | 100mV | 150mV | 200mV | 250mV | 300mV |
|---|---|---|---|---|---|---|
| 500 | FAIL | FAIL | FAIL | FAIL | FAIL | FAIL |
| 250 | 0.5:1<br>52%,43.04m | FAIL | FAIL | FAIL | FAIL | FAIL |
| 100 | 2:1<br>64%,59.36m | 1:1<br>57%,52.98m | FAIL | FAIL | FAIL | FAIL |
| 75 | 3:1<br>67%,59.22m | 1:1<br>62%,36.22m | 0.5:1<br>47%,61.74m | FAIL | FAIL | FAIL |
| 50 | 6:1<br>72%,58.63m | 3:1<br>67%,59.98m | 1:1<br>54%,69.01m | FAIL | FAIL | FAIL |
| 45 | 6:1<br>74%,46.84m | 4:1<br>69%,67.02m | 1:1<br>56%,58.05m | FAIL | FAIL | FAIL |
| 40 | 6:1<br>75%,35.83m | 5:1<br>70%,67.23m | 1:1<br>58%,48.24m | FAIL | FAIL | FAIL |
| 35 | 6:1<br>77%,25.91m | 6:1<br>72%,60.95m | 1:1<br>61%,38.90m | 0.5:1<br>46%,66.03m | FAIL | FAIL |
| 30 | 6:1<br>79%,17.43m | 6:1<br>74%,42.19m | 2:1<br>63%,61.73m | 0.5:1<br>50%,49.67m | FAIL | FAIL |
| 25 | 6:1<br>81%,10.61m | 6:1<br>77%,26.32m | 3:1<br>66%,66.53m | 1:1<br>53%,74.99m | FAIL | FAIL |
| 20 | 6:1<br>83%,7.185m | 6:1<br>80%,14.01m | 5:1<br>70%,69.23m | 1:1<br>58%,48.84m | FAIL | FAIL |
| 15 | 6:1<br>86%,7.100m | 6:1<br>83%,7.100m | 6:1<br>75%,38.14m | 2:1<br>64%,56.36m | 0.5:1<br>52%,43.20m | FAIL |
| 12.5 | 6:1<br>88%,7.033m | 6:1<br>85%,7.033m | 6:1<br>78%,21.59m | 3:1<br>68%,55.93m | 1:1<br>56%,60.60m | FAIL |
| 10 | 6:1<br>89%,6.933m | 6:1<br>87%,6.933m | 6:1<br>81%,10.40m | 6:1<br>72%,62.74m | 1:1<br>62%,36.26m | 0.5:1<br>49%,53.53m |
| 7.5 | 6:1<br>91%,6.770m | 6:1<br>89%,6.770m | 6:1<br>84%,6.770m | 6:1<br>77%,23.76m | 3:1<br>68%,54.39m | 1:1<br>57%,53.47m |
| 5 | 6:1<br>94%,6.456m | 6:1<br>92%,6.456m | 6:1<br>89%,6.456m | 6:1<br>83%,6.456m | 6:1<br>77%,27.98m | 3:1<br>68%,54.02m |
| 2.5 | 6:1<br>96%,5.604m | 6:1<br>95%,5.604m | 6:1<br>93%,5.604m | 6:1<br>90%,5.604m | 6:1<br>87%,5.604m | 6:1<br>82%,7.570m |

PROCESS AND SYSTEM FOR DEVELOPING DYNAMIC CIRCUIT GUIDELINES

CROSS-REFERENCE TO RELATED APPLICATIONS

This application is related to concurrently filed and commonly assigned U.S. patent application Ser. No. 10/282,342, filed Oct. 29, 2002, entitled "SYSTEM AND METHOD FOR DESIGNING DYNAMIC CIRCUITS IN A SOI PROCESS", the disclosure of which is hereby incorporated herein by reference.

FIELD OF THE INVENTION

The present invention relates, in general, to development of dynamic circuits, and, more specifically, to a system and method for developing circuit design guidelines for silicon on insulator (SOI) dynamic circuits.

BACKGROUND OF THE INVENTION

The increasing speed of electronics in today's technology drives the need for faster and faster circuits. The increase in speed corresponds to a general effort to decrease size as well. High-speed circuits may be implemented in several different transistor technologies. Because of its size and speed characteristics, bulk complementary metal-oxide-semiconductor (CMOS) has been widely used to develop and design high-speed circuits. However, static CMOS circuits (i.e., a configuration of high-speed CMOS circuits using combinations of CMOS inverters) are limited by the number of components that are typically required. Static CMOS is also limited based on the number of p-type MOS (PMOS) transistors required in the circuits. Because hole mobility is significantly slower than electron mobility, PMOS devices are typically much larger than n-type MOS (NMOS) devices in order to transport an equivalent amount of current. The larger size not only increases the amount of space taken up by the PMOS, but also generally increases the parasitic capacitance over the entire system.

Dynamic circuits were developed to overcome some of these deficiencies in static CMOS circuits. FIG. 1 is a circuit schematic illustrating a typical dynamic circuit configured as an OR circuit with a DNG field effect transistor (FET). Dynamic circuit 10 comprises an arrangement of FETs configured for a particular logic function having a two-phase cycle: precharge phase and evaluation phase. Dynamic circuit 10 is configured as an OR gate through parallel FETs 105. Dynamic circuit 10 includes storage node 100, which determines the signal on output node 101 through inverter 102. Dynamic circuit 10 also includes DNG FET 103 with interstitial/DNG node 104. DNG is ground (GND) spelled backwards. The DNG FET, also referred to as a clock FET or foot FET, is typically an n-channel device at the bottom of the pull-down tree whose gate is connected to a precharge clock (not shown), preventing a stack with static inputs from pulling down during the precharge phase. During the precharge phase, storage node 100 is effectively charged or pulled-up to $V_{DD}$ and isolated from ground, which, in turn, discharges or pulls output node 101 to ground. During the evaluation phase, storage node 100 may or may not be pulled-down to ground depending on the operation of the circuit, while output node 101 may or may not go to $V_{DD}$. The output is communicated through inverter 102 coupled at the forward portion of dynamic circuit 10.

Using a dynamic circuit configuration reduces the total number of PMOS transistors necessary, which generally reduces the required surface area as well as the resulting capacitance. The switching time is also decreased because of the pre-charging of the output node during the pre-charge phase. However, at today's speeds, even dynamic CMOS technology is beginning to reach speed limitations.

SOI technology has been used in place of bulk CMOS to achieve even faster switching speeds in both static and dynamic circuits. Because the junctions in SOI transistors are isolated from the substrate, the parasitic capacitance is substantially reduced, thus, reducing both the switching speeds and power consumption. However, even though SOI technology offers the benefits of faster switching at lower power consumption, the nature of the SOI's floating body (i.e., the substrate-isolated junctions) creates substantial problems in any circuit design, and especially in dynamic circuits.

The body voltage on SOI transistors may range (i.e., "float"), both dynamically and statically, anywhere from 0 volts to $V_{DD}$. Unlike bulk CMOS technology, in which the body voltage is tied to the substrate and, therefore, does not vary, SOI body voltages may vary depending a many different criteria. As a result, each SOI-based dynamic circuit is usually modeled individually. This modeling process can be extremely time consuming and, therefore, expensive to implement. For complex circuits, many hundreds of man-hours of engineer time may be expended. Furthermore, current methods for designing such SOI dynamic circuits typically implement the use of "rules of thumb," which are basic circuit design guidelines that are generalized enough to be used with a broad range of circuit types in many different noise level environments. However, because the "rules of thumb" are designed for broad applicability, it is difficult to use these circuit design aids to design a circuit to the most favorable conditions for speed. Therefore, even though the use of SOI transistors in dynamic circuits yields substantial speed and power benefits, the design process is extremely complex, requiring substantial ad hoc design and simulation.

BRIEF SUMMARY OF THE INVENTION

The present invention is directed to a system and method for generating dynamic circuit design guidelines comprising modeling a dynamic circuit using one of a plurality of modeling circuit types, simulating the modeled dynamic circuit, extracting selected information from raw data measured during the simulating step, and analyzing the selected information to create the dynamic circuit design guidelines.

BRIEF DESCRIPTION OF THE DRAWINGS

FIG. 5A is an exemplary guidelines matrix for circuit design configured according to the teachings of one embodiment of the present invention.

DETAILED DESCRIPTION OF THE INVENTION

Figure 1:
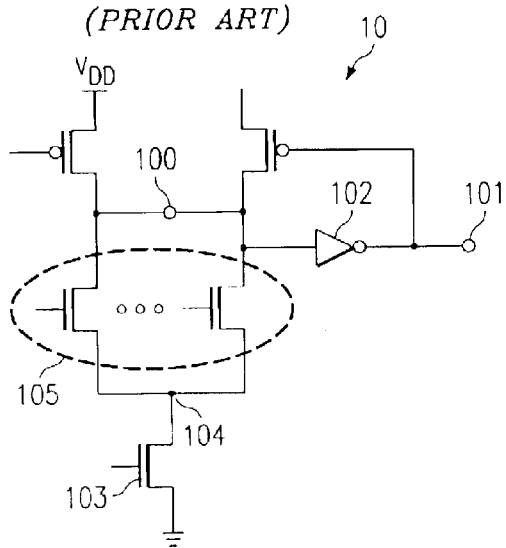
FIG. 1 is a circuit schematic illustrating a typical dynamic circuit configured as an OR circuit with a DNG FET.
Figure 2:
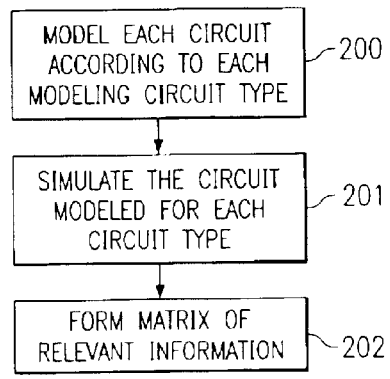
FIG. 2 is a flowchart indicating illustrative steps performed during operation of one embodiment of the present invention.

FIG. 2 is a flowchart indicating illustrative steps performed during operation of one embodiment of the present invention. In step 200, the proposed dynamic circuit is modeled using each of the modeling circuit types. Simulations are run on each circuit model modeled for the proposed dynamic circuit, in step 201. Using the raw data from each of the several simulations, matrices are generated, in step 202, of the relevant information, such as the forward inverter ratio (FIR), indexed according to other relevant data, such as pull-down/holder ratio and noise level. A circuit designer may then preferably refer to the matrix when designing SOI dynamic circuits. In one embodiment, such steps as illustrated in FIG. 2 may be executed by a computer through use of a computer program product, or the like.

Figure 3:
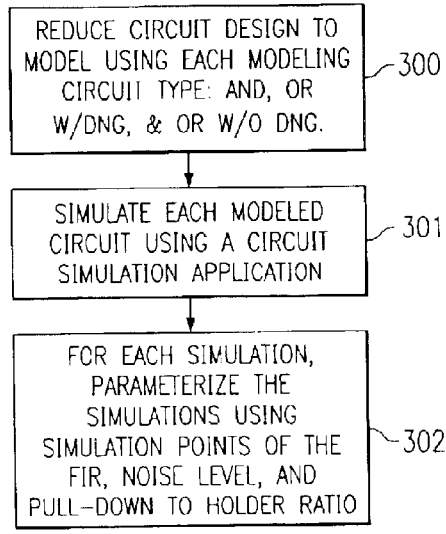
FIG. 3 is a flowchart detailing illustrative steps performed in the simulation portion of a specific embodiment of the present invention.

FIG. 3 is a flowchart detailing illustrative steps performed in the simulation portion of a specific embodiment of the present invention. In step 300, a different circuit model is generated for the proposed dynamic circuit using each modeling circuit type: AND, OR with a DNG FET, and OR without a DNG FET. "DNG," which is ground, GND, spelled backwards, is usually a FET (typically an NFET) at the bottom of the pull-down tree of the dynamic circuit, in which the DNG FET's gate is generally connected to a precharge clock that prevents a stack with static inputs from pulling down during the precharge phase. Thus, a circuit model is generated for an AND circuit model, an OR with a DNG FET circuit model, and an OR without a DNG FET circuit model. Each modeled circuit is preferably simulated, in step 301, using a circuit simulation program, such as SPICE. In step 302, the simulations are preferably parameterized using sets of simulation points for, at least, the forward inverter ratio (FIR), noise level, and pull-down/holder ratio. In one embodiment, the steps illustrated in FIG. 3 may be executed with programming logic running on a computer system.

Figure 4:
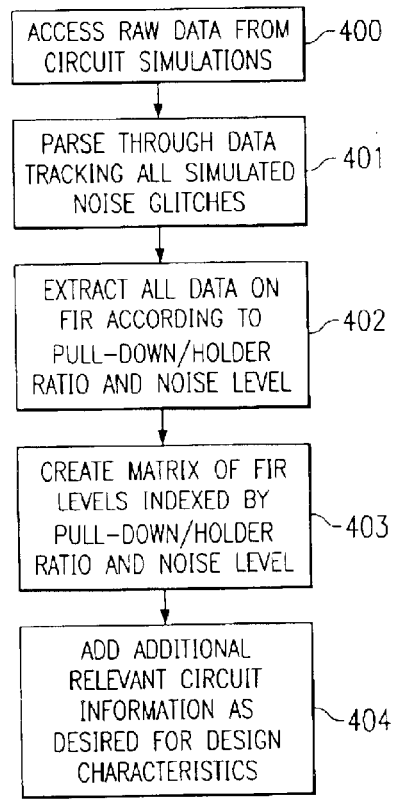
FIG. 4 is a flowchart detailing the illustrative steps detailing the matrix creation portion of a specific embodiment of the present invention.

FIG. 4 is a flowchart illustrating exemplary steps in the matrix creation portion of a specific embodiment of the present invention. In step 400, the system preferably accesses the raw data produced from each of the circuit simulations. In step 401, the system preferably parses through the raw data tracking the simulated noise glitches. Glitches are monitored to determine whether a maximum noise-glitch level, one that may detrimentally causes an unwanted evaluation of the circuit, has been exceeded. All of the data related to each FIR with corresponding data on the pull-down/holder ratio and noise level is preferably compiled in step 402. Using the compiled data, a matrix of FIR levels is preferably generated, in step 403, indexed according to the pull-down/holder ratios and noise levels. In step 404, additional relevant circuit information may be added as desired for certain design considerations and characteristics. In one embodiment, the steps illustrated in FIG. 4 may be executed with a computer program product, or the like, running on a computing system.

FIG. 5A is an exemplary guidelines matrix for circuit design configured according to the teachings of one embodiment of the present invention. Matrix 50 comprises a collection of rows and columns. In the embodiment illustrated in FIG. 5A, the rows represent pull-down/holder ratio set 51 and the columns represent noise level set 52 for a particular model circuit type. Each individual cell, such as cells 500 and 501 includes circuit design information cumulated and analyzed from the previously run simulations of the circuit models with the design parameters.

Figure 5B:
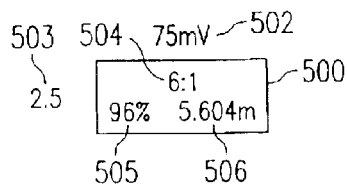
FIG. 5B is a detail of cell 500 illustrated in FIG. 5A.

FIG. 5B is a detail of cell 500 illustrated in FIG. 5A. In the embodiment illustrated in FIG. 5A, cell 500, as shown in FIG. 5B, is located at 75 mV noise level 502 and 2.5 pull-down/holder ratio 503. Cell 500 displays FIR 504 (6:1) representing the desired FIR for the noise environment and selected pull-down/holder ratio. Cell 500 also includes additional relevant information that may be useful to a circuit designer, such as dynamic node droop 505 and noise glitch 506. Designers may then preferably refer to matrix 50 in designing dynamic SOI circuits.

For example, if a designer wishes to develop a dynamic SOI circuit, two important design factors will typically be what pull-down/holder ratio and what FIR to design in order to have a circuit in which the noise glitch on the forward inverter does not exceed the predetermined maximum. The circuit design reflected in the matrix of FIG. 5A assigned a maximum noise glitch of 75 mV, as the maximum voltage of a noise glitch on the forward inverter that would not trigger an unwanted evaluation of the circuit. The appropriate matrix will preferably be selected based on what type of circuit the designer intends to create. The next determination will be to consider the noise environment in which the circuit is intended to operate.

Using this noise environment level, the designer may traverse matrix 50 (FIG. 5A) along noise level axis 52 for any variety of circuit designs that will comply with that selected noise level. The designer will select the particular architecture dependent on the allowable or necessary pull-down/holder ratio to be maintained and, what FIR is suggested to maintain the noise level considering the selected pull-down/holder ratio. Therefore, if the noise environment is to be 75 mV, the designer could select cell 500 and design the dynamic circuit having a 2.5 pull-down/holder ratio and a FIR of 6:1 that would result in a noise glitch of approximately 5.604 mV and a node droop of 96%. Previously, the developer would have had to individually model and test each design proposal.

Similarly, if the developer needs to design a circuit for use in a noise environment of 300 mV, he or she could not select pull-down/holder ratios above 12.5 that would yield suitable noise glitches. Cell 501 of FIG. 5A contains "FAIL" which indicates that the noise glitch measured in the simulation of a 300 mV noise environment with a 12.5 pull-down/holder ratio exceeded the maximum noise glitch of 75 mV (for the embodiment addressed in FIGS. 5A and 5B), and, thus, the circuit failed. By using matrix 50, SOI dynamic circuit designers may preferably streamline the design process by systematizing the initial design choices with pre-simulated data.

Additionally, beyond the initial design of dynamic circuits, circuit updates and improvements driven by new and proposed new FET designs also benefit for the automated table generation process of embodiments of the present invention. For example, if a new FET model is manufactured or designed, circuit engineers may preferably plug in the new FET parameters into the simulation applications to re-simulate and generate the dynamic circuit design guidelines. In this manner, circuit engineers and designers may analyze circuit improvements of proposed new FET changes. Moreover, the circuit engineers and designers may preferably analyze the expected performance changes for various FET changes and selections without requiring substantial individual analysis.

It should be noted that the embodiment described herein addresses the circuit design criteria that may be used in the 501 dynamic circuit design methodology described in co-pending, commonly assigned patent application entitled, "SYSTEM AND METHOD FOR DESIGNING DYNAMIC CIRCUITS IN A SOI PROCESS," Ser. No. 10/282,342, filed Oct. 29, 2002. The present invention is not limited to generating dynamic circuit design guidelines only in a SOI process nor only with the design methodology disclosed in the above-cited related application. The present invention may be applied to generating circuit design guidelines in other contexts as well.

What is claimed is:

1. A method for generating dynamic circuit design guidelines comprising:
   modeling a dynamic circuit using one of a plurality of modeling logic circuits;
   simulating said modeled dynamic circuit;
   automatically extracting information from raw data produced during said simulating step; and
   automatically analyzing said information a matrix of said dynamic circuit design guidelines.

2. The method of claim 1 further comprising:
   compiling said a matrix from said dynamic circuit design guidelines.

3. The method of claim 1 wherein said simulating step includes:
   parameterizing said simulating step using sets of selected design parameters.

4. The method of claim 3 further comprising:
   re-simulating said modeled dynamic circuit using additional sets of selected design parameters.

5. The method of claim 1 further comprising:
   compiling a matrix of FIR indexed according to a set of noise level figures and a set of pull-down to holder ratios.

6. The method of claim 5 further comprising:
   adding additional circuit information to said matrix relevant to said dynamic circuit design guidelines.

7. The method of claim 1 wherein said plurality of modeling logic circuits comprises:
   an AND circuit;
   an OR circuit with a DNG field effect transistor (FET); and
   an OR circuit without a DNG FET.

8. A method for generating dynamic circuit design guidelines comprising:
   modeling a dynamic circuit using one of a plurality of modeling circuit types;
   simulating said modeled dynamic circuit, including parameterizing said simulating step using sets of selected design parameters, wherein said sets of selected design parameters include at least:
   a set of forward inverter ratios (FIR);
   a set of noise level figures; and
   a set of pull-down to holder ratios;
   automatically extracting information from raw data produced during said simulating step; and
   automatically analyzing said information to create said dynamic circuit design guidelines.

9. The method of claim 8 further comprising:
   compiling a matrix of FIR indexed according to said set of noise level figures and said set of pull-down to holder ratios.

10. The method of claim 9 further comprising:
    adding additional circuit information to said matrix relevant to said dynamic circuit design guidelines.

11. The method of claim 8 wherein said plurality of modeling logic circuits comprises:
    an AND circuit;
    an OR circuit with a DNG field effect transistor (FET); and
    an OR circuit without a DNG FET.

12. The method of claim 8 further comprising:
    parameterizing said simulating step using sets of selected design parameters; and
    re-simulating said modeled dynamic circuit using additional sets of selected design parameters.

13. A system for developing dynamic circuit design guidelines comprising:
    a plurality of matrices having dynamic circuit design guidelines arranged therein:
    wherein each of said plurality of matrices corresponds to one of a plurality of modeling logic circuits;
    wherein said dynamic circuit design guidelines are compiled from raw data calculated in simulations of a dynamic circuit modeled in each of said plurality of modeling logic circuits; and
    wherein one of said plurality of matrices is selected by a designer according to a logic circuit design choice for said dynamic circuit.

14. The system of claim 13 wherein said plurality of modeling logic circuits comprises:
    an AND circuit;
    an OR circuit with a DNG field effect transistor (FET); and
    an OR circuit without a DNG FET.

15. The system of claim 13 wherein said dynamic circuit design guidelines are used to parameterize said simulations.

16. A system for developing dynamic circuit design guidelines comprising:
    a plurality of matrices having dynamic circuit design guidelines arranged therein, wherein said dynamic circuit design guidelines comprise at least:
    forward inverter ratio (FIR);
    noise level; and
    pull-down to holder ratio;
    wherein each of said plurality of matrices corresponds to one of a plurality of modeling circuit types;
    wherein said dynamic circuit design guidelines are compiled from raw data calculated in simulations of a dynamic circuit modeled in each of said plurality of modeling circuit types; and
    wherein one of said plurality of matrices is selected by a designer according to a circuit type design choice for said dynamic circuit.

17. The system of claim 16 wherein said plurality of modeling logic circuits comprises:
    an AND circuit;
    an OR circuit with a DNG field effect transistor (FET); and
    an OR circuit without a DNG FET.

18. The system of claim 16 wherein said dynamic circuit design guidelines are used to parameterize said simulations.

19. A computer program product having a computer readable medium with computer program logic recorded thereon, said computer program product comprising:
    code for modeling a silicon on insulator (SOD dynamic circuit into one of a plurality of circuit models;
    code for simulating said modeled SOI dynamic circuit;
    code for selecting data from measurements taken during said code for simulating; and
    code for analyzing said selected data to create a matrix of design guidelines.

20. The computer program product of claim 19 wherein said simulating step includes:
    code for parameterizing said code for simulating using sets of design parameters.

21. The computer program product of claim 20 further comprising:
   code for re-simulating said modeled SOI dynamic circuit using additional sets of design parameters.

22. The computer program product of claim 19 wherein said plurality of circuit models comprises:
   an AND circuit;
   an OR circuit with a DNG field effect transistor (FET); and
   an OR circuit without a DNG FET.

23. The computer program product of claim 19 wherein said matrix of design guidelines includes a FIR indexed according to a set of noise level figures and a set of pull-down-to-holder ratios.

24. The computer program product of claim 23 further comprising: code for providing additional circuit data relevant to said SOI dynamic circuit design guidelines to said matrix of design guidelines.

25. A computer program product having a computer readable medium with computer program logic recorded thereon, said computer program product comprising:
   code for modeling a silicon on insulator (SOI) dynamic circuit into one of a plurality of circuit models;
   code for simulating said modeled SOI dynamic circuit, wherein said simulating step includes code for parameterizing said code for simulating using sets of design parameters, and wherein said sets of design parameters include at least:
      a set of forward inverter ratios (FIR);
      a set of noise level figures; and
      a set of pull-down-to-holder ratios;
   code for selecting data from measurements taken during said code for simulating; and
   code for analyzing said selected data to create a matrix of design guidelines.

26. The computer program product of claim 25 wherein said matrix of design guidelines includes a FIR indexed according to said set of noise level figures and said set of pull-down-to-holder ratios.

27. The computer program product of claim 26 further comprising:
   code for providing additional circuit data relevant to said SOI dynamic circuit design guidelines to said matrix of design guidelines.

28. A method for designing a silicon on insulator (SOI) dynamic circuit comprising:
   selecting a logic circuit type for said SOI dynamic circuit;
   choosing a design matrix according to said selecting step;
   identifying a noise level corresponding to a noise environment for said SOI dynamic circuit, wherein said design matrix is indexed by said noise level;
   picking a holder ratio for said SOI dynamic circuit, wherein said design matrix is indexed by said holder ratio; and
   designing said SOI dynamic circuit using a forward inverter ratio (FIR) corresponding to said noise level and said holder ratio, wherein said FIR is included in said design matrix indexed according to said noise level and said holder ratio.

29. The method of claim 28 wherein said design matrix is compiled by simulating each of said logic circuit type according to said noise level, said holder ratio, and said FIR.

30. The method of claim 28 wherein said design matrix is re-compiled by re-simulating each of said logic circuit type according to an additional noise level, an additional holder ratio, and an additional FIR.

* * * * *